(12) United States Patent
Ba-Tis et al.

(10) Patent No.: US 10,241,129 B1
(45) Date of Patent: Mar. 26, 2019

(54) MEMS PISTON-TUBE BASED CAPACITIVE ACCELEROMETER

(71) Applicants: Faez Ba-Tis, Toronto (CA); Ridha Ben-Mrad, Toronto (CA)

(72) Inventors: Faez Ba-Tis, Toronto (CA); Ridha Ben-Mrad, Toronto (CA)

( * ) Notice: Subject to any disclaimer, the term of this patent is extended or adjusted under 35 U.S.C. 154(b) by 324 days.

(21) Appl. No.: 15/044,131

(22) Filed: Feb. 16, 2016

Related U.S. Application Data

(63) Continuation-in-part of application No. 14/449,544, filed on Aug. 1, 2014, now Pat. No. 9,306,475.

(60) Provisional application No. 62/118,274, filed on Feb. 19, 2015.

(51) Int. Cl.
| | | |
|---|---|---|
| *G01P 15/125* | (2006.01) | |
| *H02N 1/08* | (2006.01) | |
| *G01P 15/02* | (2013.01) | |

(52) U.S. Cl.
CPC .................... *G01P 15/125* (2013.01)

(58) Field of Classification Search
CPC ........ G01P 15/125; G01P 15/08; G01P 15/02; G01P 15/00; H02N 1/08
See application file for complete search history.

(56) References Cited

U.S. PATENT DOCUMENTS

| | | | | |
|---|---|---|---|---|
| 5,572,057 A * | 11/1996 | Yamamoto | .......... | G01P 15/0802 257/417 |
| 5,780,948 A * | 7/1998 | Lee | ........................ | F16F 7/1011 310/20 |
| 6,308,573 B1 * | 10/2001 | Lee | ........................ | B81B 3/0094 310/309 |
| 6,384,952 B1 * | 5/2002 | Clark | ...................... | G02B 26/06 359/200.6 |
| 6,402,968 B1 * | 6/2002 | Yazdi | .................. | G01P 15/0802 216/2 |
| 6,545,385 B2 * | 4/2003 | Miller | ..................... | B81B 3/004 310/309 |
| 6,705,166 B2 * | 3/2004 | Leonardson | ............ | G01L 1/148 73/514.32 |
| 7,258,011 B2 * | 8/2007 | Nasiri | ..................... | G01P 1/023 73/510 |
| 7,258,012 B2 * | 8/2007 | Xie | ........................ | B81B 3/0062 73/510 |

(Continued)

*Primary Examiner* — Edgardo San Martin
(74) *Attorney, Agent, or Firm* — Nasser Ashgriz; UIPatent Inc.

(57) ABSTRACT

A novel high resolution, low noise MEMS capacitive accelerometer is disclosed. The accelerometer utilizes a piston-tube electrode configuration that enables the use of a wide area for the electrodes. Therefore, a high capacitive sensitivity is achieved. The accelerometer consists of two structures: upper and lower. The lower structure contains a plurality of fixed electrodes that are attached to the base and have a piston-style shape (teeth). Those pistons form the sensing electrodes of the accelerometer. The upper structure contains a plurality of moving electrodes that have a tube-style shape (through holes), and they are attached to a substrate via restoring mechanical springs. The proof mass of the accelerometer is distributed around these tubes to reduce squeeze thin film damping in the system. The accelerometer is able to sense linear acceleration along the z-axis and/or the angular acceleration about the in-plane axes (x and y).

11 Claims, 10 Drawing Sheets

No acceleration is applied (rest position)

Acceleration applied in towards the base (negative direction of Z axis)

(56) References Cited

U.S. PATENT DOCUMENTS

| | | | | |
|---|---|---|---|---|
| 7,578,189 B1* | 8/2009 | Mehregany | ......... | B81C 1/00182 |
| | | | | 73/514.18 |
| 7,690,255 B2* | 4/2010 | Gogoi | ................. | G01P 15/0802 |
| | | | | 438/50 |
| 7,934,423 B2* | 5/2011 | Nasiri | ................. | G01P 15/0802 |
| | | | | 73/514.02 |
| 8,205,498 B2* | 6/2012 | Hsu | ...................... | G01P 15/125 |
| | | | | 73/514.32 |
| 9,306,475 B1* | 4/2016 | Ba-Tis | ................... | H02N 1/006 |
| 9,529,470 B2* | 12/2016 | Ba-Tis | ................... | G06F 3/0414 |
| 2001/0048265 A1* | 12/2001 | Miller | ..................... | B81B 3/004 |
| | | | | 310/309 |
| 2009/0152980 A1* | 6/2009 | Huang | ................. | B06B 1/0238 |
| | | | | 310/309 |
| 2009/0322260 A1* | 12/2009 | Lee | ...................... | B81B 3/0021 |
| | | | | 318/116 |
| 2012/0000287 A1* | 1/2012 | Frangi | .................. | G01P 15/125 |
| | | | | 73/514.32 |
| 2014/0125950 A1* | 5/2014 | Shimada | ............ | G02B 26/0841 |
| | | | | 351/206 |

\* cited by examiner

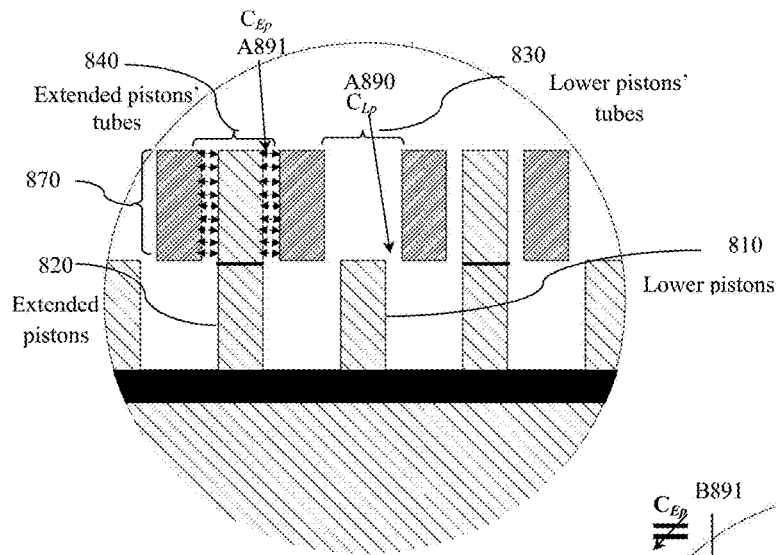
No acceleration is applied (rest position)
FIG. 8A
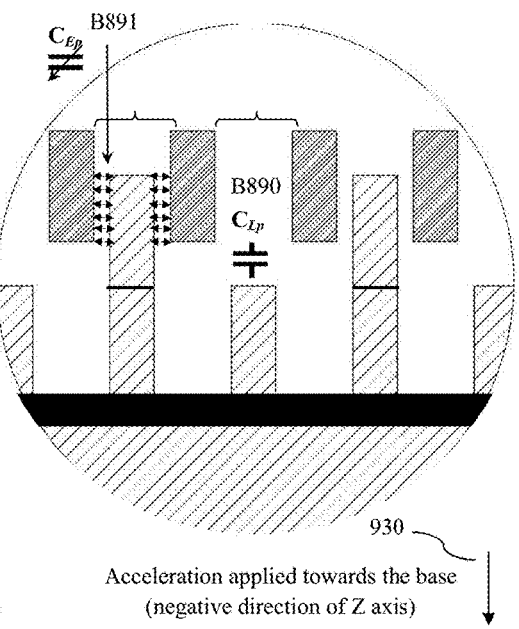
Acceleration applied towards the base
(negative direction of Z axis)
FIG. 8B
Acceleration applied in towards the base
(negative direction of Z axis)
FIG. 8C

MEMS PISTON-TUBE BASED CAPACITIVE ACCELEROMETER

RELATED APPLICATION

This application claims the priority date of provisional patent application No. 62/118,274 filed Feb. 19, 2015, and repeats a substantial portion of prior application Ser. No. 14/449,544, filed Aug. 1, 2014, and adds and claims additional disclosure not presented in the prior application. Since this application names the same inventors as in the prior application, it may constitute a continuation-in-part of the prior application.

FIELD OF THE INVENTION

The invention relates to the field of MEMS capacitive accelerometers. In particular, it is related to highly sensitive, low noise MEMS capacitive accelerometers that are able to measure micro/nano-g acceleration and are used for high precision applications.

BACKGROUND OF THE INVENTION

High performance accelerometers are being increasingly used for high-end accelerometer applications that require inertial grade specifications. These applications include inertial navigation/guidance systems, geophysical sensing, unmanned aircraft stabilization, robotics, earthquake detection and space micro-gravity measurement applications [1][2][3].

Capacitive accelerometers are the most commonly used acceleration sensors as they are easy and inexpensive to fabricate. They offer low power consumption, low non-linearity, and high reliability and sensitivity [4][5][6].

The performance of the MEMS accelerometers is determined by the level of the noise floor present in the system. This noise floor is mainly classified into two categories of noise: Brownian Noise Equivalent Acceleration (BNEA) and Circuit Noise Equivalent Acceleration (CNEA). The Brownian Noise can be reduced by increasing the proof mass size and decreasing the damping coefficient in the accelerometer. It is governed by the following equation [3][7].

$$BNEA = \frac{\sqrt{4k_B TD}}{m}$$

where $k_B$ is Boltzmann's constant (J/K), T is the absolute temperature, D is the damping coefficient, and m is the proof mass. D is related to the thin film of gas trapped either between the proof mass and substrate or between the moving and fixed sensing electrodes. Most out-of-plane-axis accelerometers developed so far, utilize a lumped (solid) proof mass and as such a squeeze thin film damping is present between the proof mass and substrate which greatly reduces the quality factor of the accelerometers; thus increasing the Brownian noise. Perforations might be embedded in the lumped mass to reduce damping, but that reduces the mass size; hence, Brownian noise is still largely present. Other methods that have been used to reduce BNEA include using vacuum packaging of the accelerometer, or operating the accelerometer in a closed loop mode to maintain the mass in the rest position. However, vacuum packaging is an expensive process and the closed loop mode of operation is not desirable for low cost and low power applications. The closed loop mode also adds complexity to the read-out circuit of the accelerometer. [4][2][8].

The second type of noise, i.e. CNEA, is inversely proportional to the capacitive sensitivity ($S_c$) of the sensing element and is governed by the following equation [3][1].

$$CNEA = \frac{\Delta C_{min}}{S_c}$$

where $\Delta C_{min}$ is the resolution of the interface circuit, and $S_c$ is the capacitive sensitivity of the accelerometer. As the capacitive sensitivity of the accelerometer increases, the CNEA decreases. However, the electrode configurations of currently available accelerometers are not area efficient in terms of generating large capacitance change, which results in small values of the capacitive sensitivity. In the current high performance accelerometers, the electrode configurations use either parallel plates or comb-drives. The former offers fairly large capacitive sensitivity, but that comes at the expense of having significant squeeze thin damping as well as limits on the travel range of the proof mass. The latter offers highly linear measurements. However, it provides relatively small values of capacitive sensitivity as the area of capacitance cannot be largely increased as the fingers have a cantilever-style structure, making them limited in length.

Such inefficient electrode configurations and lumped (solid) proof mass structures are described in U.S. Pat. No. 7,934,423 B2, U.S. Pat. No. 7,258,011 B2, U.S. Pat. No. 7,578,189 B1, US 2012/0000287 A1, U.S. Pat. No. 8,205,498 B2, U.S. Pat. No. 7,690,255 B2, U.S. Pat. No. 6,402,968 B1, and U.S. Pat. No. 7,258,012 B2.

The challenges in having a sub-micro-g MEMS capacitive accelerometers could thus be summarized as follows:
1—A solid proof mass leads to a significant squeeze thin film damping that increases the BNEA.
2—Current electrode configurations of the MEMS capacitive accelerometers provide limited capacitive sensitivity that increases the CNEA.

SUMMARY OF THE INVENTION

To overcome the above-mentioned challenges, a MEMS capacitive accelerometer utilizing a piston-tube electrode configuration is developed. The piston-tube electrode configuration was previously implemented in MEMS micro electrostatic actuators to develop 3 degrees of freedom electrostatic microactuators able to generate large force. The piston-tube electrostatic microactuator was described in detail in patent application U.S. Ser. No. 14/449,544 and PCT/IB2014/001498, which are incorporated by reference herein. By utilizing a piston-tube electrode configuration in MEMS capacitive accelerometers, the damping coefficient is significantly reduced as it eliminates the squeeze thin film damping effects by distributing the proof mass around the tubes which are through holes on the moving electrodes. Squeeze thin film damping becomes especially significant when a thin layer of gas is sandwiched between two plates, and the thickness of this gas layer is less or equal than one third of the width of the surface area of the plate [9]. For the design disclosed in this invention, such layer doesn't exist along the sensitive (i.e. active) axis of the accelerometer. The thickness of the gas layer 114, please refer to FIG. 5A, is by far greater than one third of the width of the ribbed patterns in the moving structure (that includes the structure surrounding the tubes as well as the supporting springs). In the present invention, the slide thin film is the dominant damping effect along the sensitive axis of the accelerometer, and it has less damping effect than the squeeze film as the squeeze film adds both damping and stiffness effects to the system [10]. This results in a small overall damping coefficient, thus a high quality factor, which significantly reduces the Brownian Noise.

Another feature of the piston-tube electrode configuration is the high static capacitive sensitivity over a wide dynamic range. This is enabled by the large travel range (i.e. only limited by the height of the pistons) available for the proof mass (mass spread around the tubes) to move and the large capacitance associated with the piston-tube electrode configuration. This feature largely reduces the CNEA and provides a highly linear response of the accelerometer (acceleration-capacitance curve).

The main advantages of the present invention are as follows:
1—Reduction of the BNEA: A low BNEA by having a large mass that is distributed across the moving electrodes and a low damping coefficient as the structure is characterized by negligible squeeze thin film damping.
2—Reduction of the CNEA: The piston-tube electrode configuration provides for a large capacitance per unit area; thus providing a high capacitive sensitivity that reduces the CNEA.
3—High linearity: As the piston and tube are interdigitated during acceleration, the change in the capacitance is highly linear as opposed to the parallel plate electrode configuration, thus eliminating the need for a differential capacitance configuration of the electrode.
4—Low off-axis sensitivity: The present invention utilizes a flexure mechanism that has a high ratio of in-plane stiffness to out-of-plane stiffness, which reduces the sensitivity to the in-plane accelerations that the device might experience.
5—Ability to measure linear acceleration along the z-axis and angular acceleration about the in-plane axes (x and y).

Using the novel design of the MEMS capacitive accelerometer that is explained in detail herein below, the ability of detection of tens of nano-g acceleration is possible using a high resolution $\Delta C_{min}$ read-out circuit ($\Delta C_{min}$<10 aF) at low frequencies (e.g. below 10 Hz). This opens the door for a wide range of applications in the future for MEMS capacitive accelerometers and makes them competitive with geophones and seismometers.

A novel MEMS capacitive accelerometer that utilizes a piston-tube configuration is provided. The accelerometer consists of two structures: lower and upper. The lower structure contains a plurality of pistons (teeth) which could have a square, circular, or any other shape. These pistons are attached to the base and protrude in a perpendicular direction to it, and they form the sensing electrodes of the accelerometer. The upper structure contains a plurality of tubes (through holes) that have cross-sections similar to the cross-sections of the pistons. The moving mass around the tubes forms the proof mass, and they are suspended by three or more supporting springs to return the accelerometer proof mass to its initial position in the absence of an applied acceleration. The pistons could be divided into multiple groups that are electrically separated from each other to provide detection of the bi-axial angular acceleration about the in-plane axes (x and y).

When an external linear acceleration along the upward direction of the out-of-plane axis (positive direction of the z-axis) is applied, the relative motion of the proof mass, which is distributed around the tubes, with respect to the pistons is in the opposite direction and in this case results in a higher engagement of the pistons and tubes and the sensing electrodes sense the amount of this relative motion using a read-out circuit; hence the linear acceleration could be detected. Such embodiment is only able to measure linear acceleration along one direction, i.e. upward direction along the out-of-plane axis. This embodiment is also able to measure the rotational acceleration about the in-plane axes (x and y).

In another embodiment of the present invention, a bi-directional piston-tube based accelerometer that is able to measure the acceleration along the two directions of the out-of-plane axis (i.e. positive and negative directions of the z-axis) is provided. The bi-directional capacitance change is achieved by extending half the number of the pistons that are located in the lower structure, to the upper structure during the fabrication process, so that when the tubes move away from the pistons (towards the positive z-axis) the acceleration is detected.

It is important to highlight that the present invention is not intended to be limited to embodiments explained herein, but it is to be accorded the widest scope consistent with the principles and features described herein. It is apparent to the one skilled in the art that various modifications could be done on this novel invention without departing from the spirit and the scope of the invention.

BRIEF DESCRIPTION OF DRAWINGS

Embodiments herein will hereinafter be described in conjunction with the appended drawings provided to illustrate and not to limit the scope of the claims, wherein like designations denote like elements, and in which:

FIG. 8A is a detailed cross-sectional view of the bi-directional accelerometer illustrating the capacitances between the extended pistons and lower pistons in conjunction with the corresponding tubes of the bi-directional accelerometer.

FIG. 8B is a detailed cross-sectional view of the bi-directional accelerometer during the upward movement (i.e. away from the substrate) of the proof mass (tubes) illustrating the change in the capacitances between the extended pistons and lower pistons with the corresponding tubes.

FIG. 8C is a detailed cross-sectional view of the bi-directional accelerometer during the downward movement (i.e. towards the substrate) of the moving structure (tubes) illustrating the change in the capacitances between the extended pistons and lower pistons with the corresponding tubes.

DETAILED DESCRIPTION OF THE INVENTION

An embodiment of the MEMS capacitive accelerometer is illustrated in FIG. 1-5. It consists of two structures. The lower structure 100 in the embodiment is shown in FIG. 1A-B, and it forms a plurality of rectangular-shaped pistons (teeth) 110 111 112 113, and the upper structure 200 is shown in FIG. 2A-B, and it forms a plurality of rectangular-shaped tubes (openings) 210, that correspond to the pistons in the lower structure.

Figure 1A:
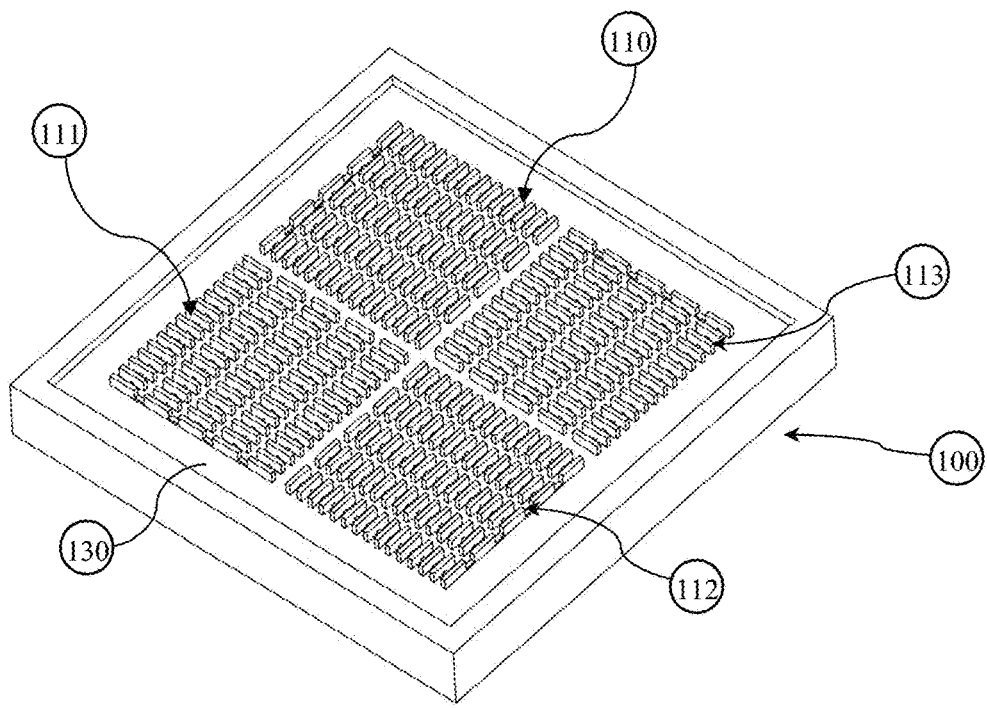
FIG. 1A illustrates the lower structure (pistons) of the piston-tube capacitive accelerometer.
Figure 1B:
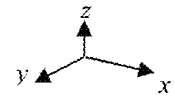
FIG. 1B is a top view illustrating the lower structure (pistons) of the piston-tube capacitive accelerometer.
Figure 1B:
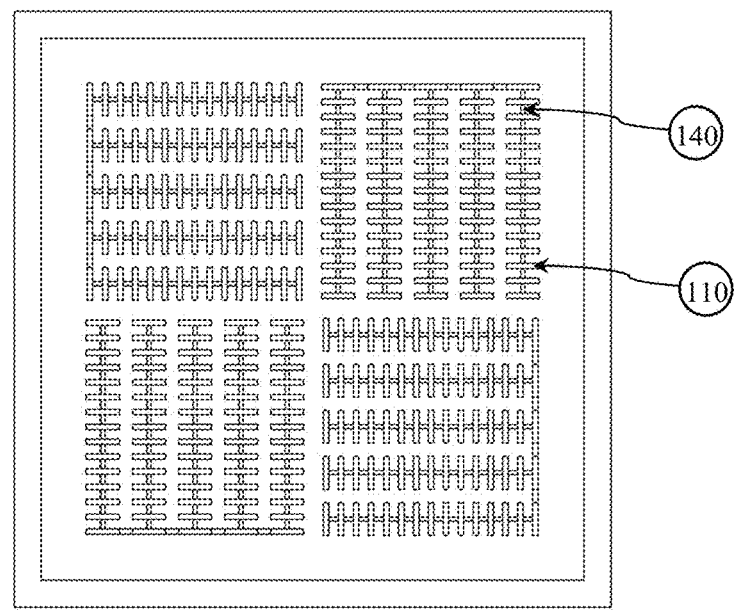
Figure 2A:
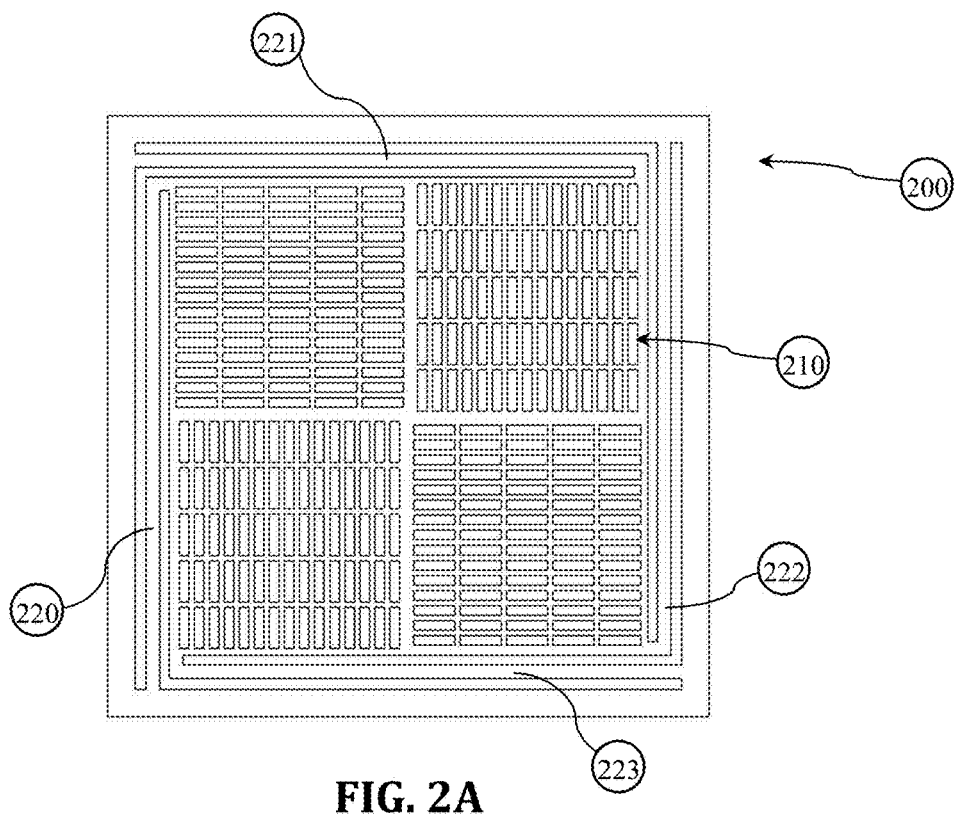
FIG. 2A is a top view illustrating the upper structure (tubes) of the piston-tube capacitive accelerometer.
Figure 2B:
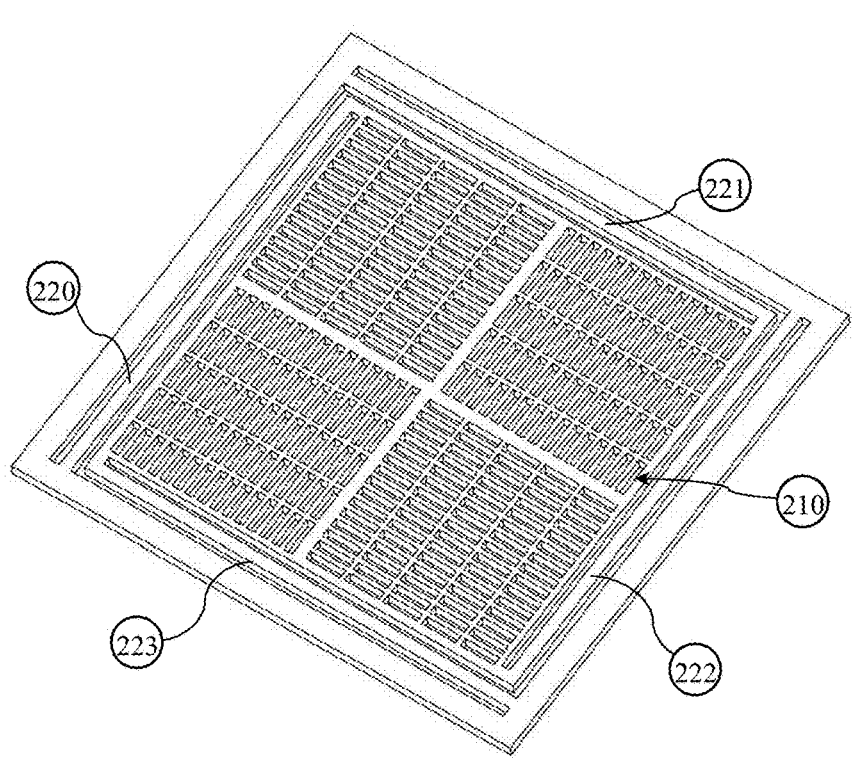
FIG. 2B is a perspective view illustrating the upper structure (tubes) of the piston-tube capacitive accelerometer.
Figure 3:
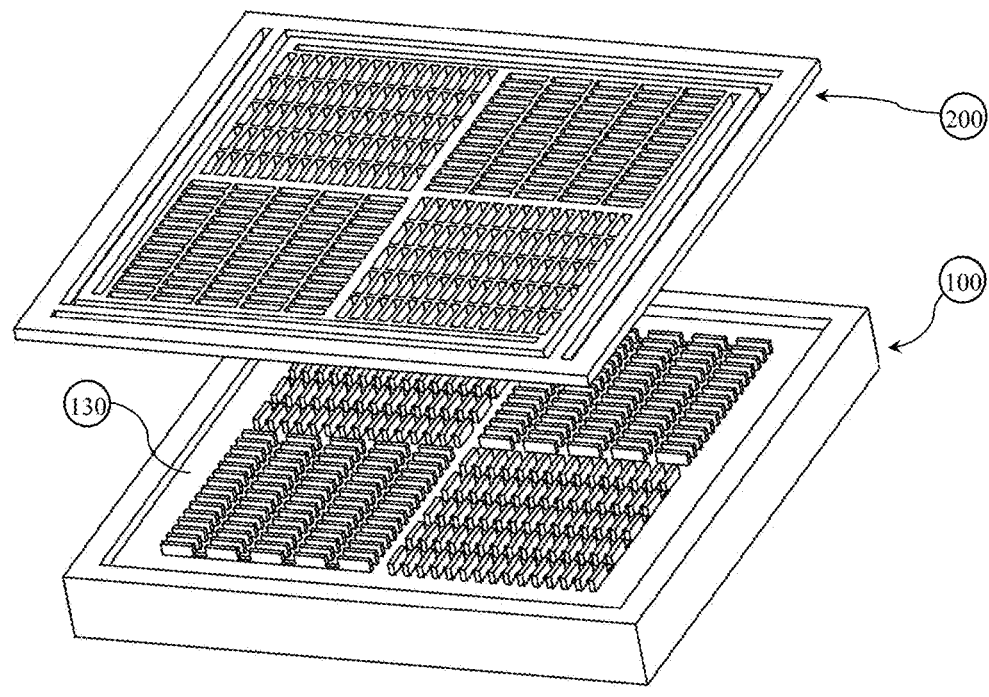
FIG. 3 is an exploded view of the piston-tube capacitive accelerometer illustrating the lower structure containing pistons (fixed electrodes) and the upper structure containing the tubes (moving electrodes).
Figure 4:
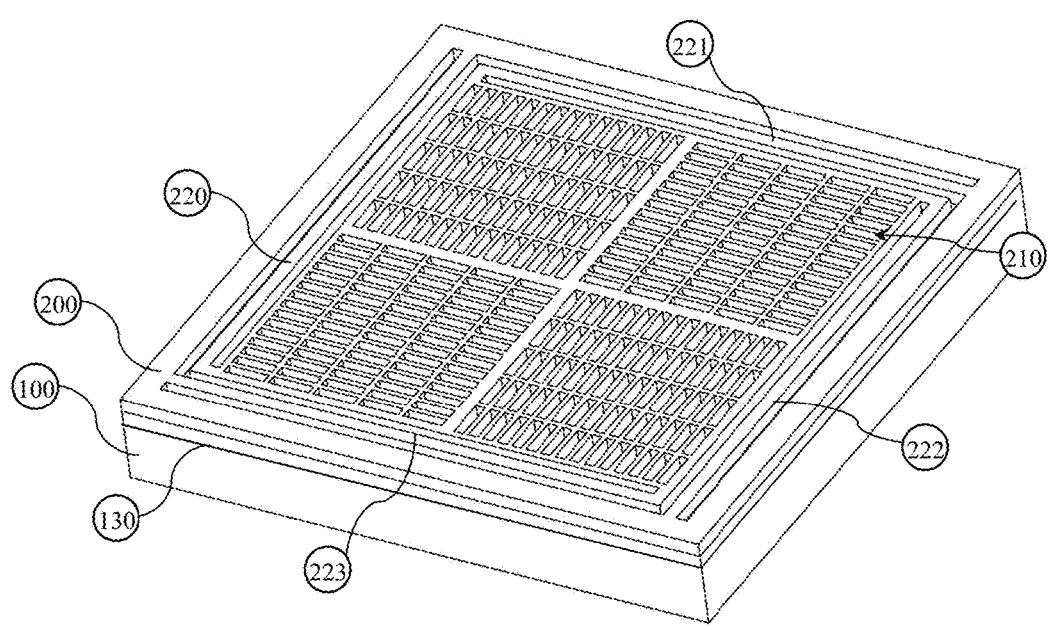
FIG. 4 is a perspective view illustrating the final bonded structure of the piston-tube capacitive accelerometer.
Figure 9:
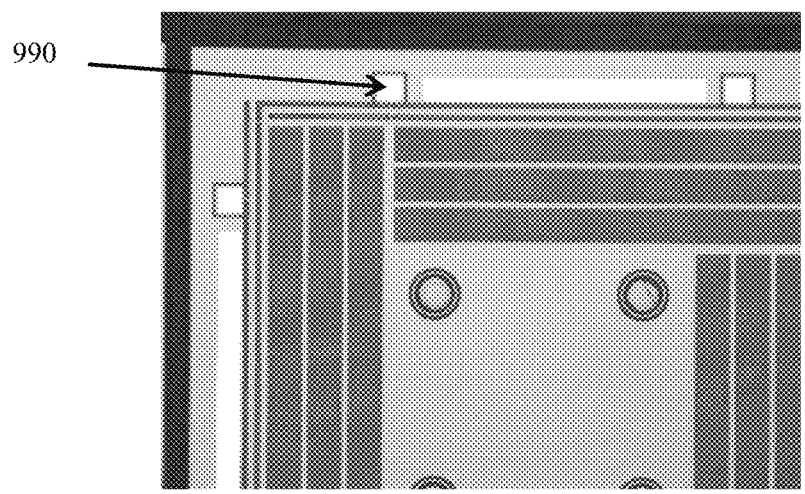
FIG. 9 is a snapshot of a fabricated prototype of an embodiment of the piston-tube based accelerometer with partially solid (lumped) proof mass.

The pistons could form one or multiple sensing electrodes (preferably four), and they protrude vertically towards the upper structure and extend horizontally along the two in-plane axes (x and y). Each sensing electrode is electrically isolated form other sensing electrodes by utilizing the Buried Oxide (BOX) layer 130 of an SOI wafer or any other dielectric layer. The pistons within each single group (sensing electrode) are electrically connected to each other via a small thickness (height) layer 140 forming a single capacitor with the moving (common) electrode in the upper structure. It will be readily clear to the one with ordinary skills in the art that this layer 140, shown in FIG. 1B, is connected to the outer fixed periphery which is divided into different electrical pads by means of DRIE etching. Each pad 990, refer to FIG. 9, is electrically addressable. The goal of dividing the pistons into multiple electrodes is to enable the detection of the angular acceleration about the in-plane axes.

The tubes 210 form the moving electrode, which is a common electrode that in conjunction with the lower sensing electrodes 110 111 112 113 make up the capacitors. The mass of the tubes is considered the proof mass of the accelerometer. The tubes are rectangular through holes, and they are vertically aligned with the pistons (sensing electrodes). The cross-section of the tubes is larger than that of the pistons so that the pistons penetrate along the tubes during the acceleration. In other words, a horizontal gap 224 between the outer sides of the pistons and inner sides of the tubes exist, refer to the cross sectional view in FIG. 5, where only faces along the B-B line are shown in the figure for the sake of clarity. The moving structure containing the tubes is attached to the substrate by multiple supporting springs 220 221 222 223.

Figure 5A:
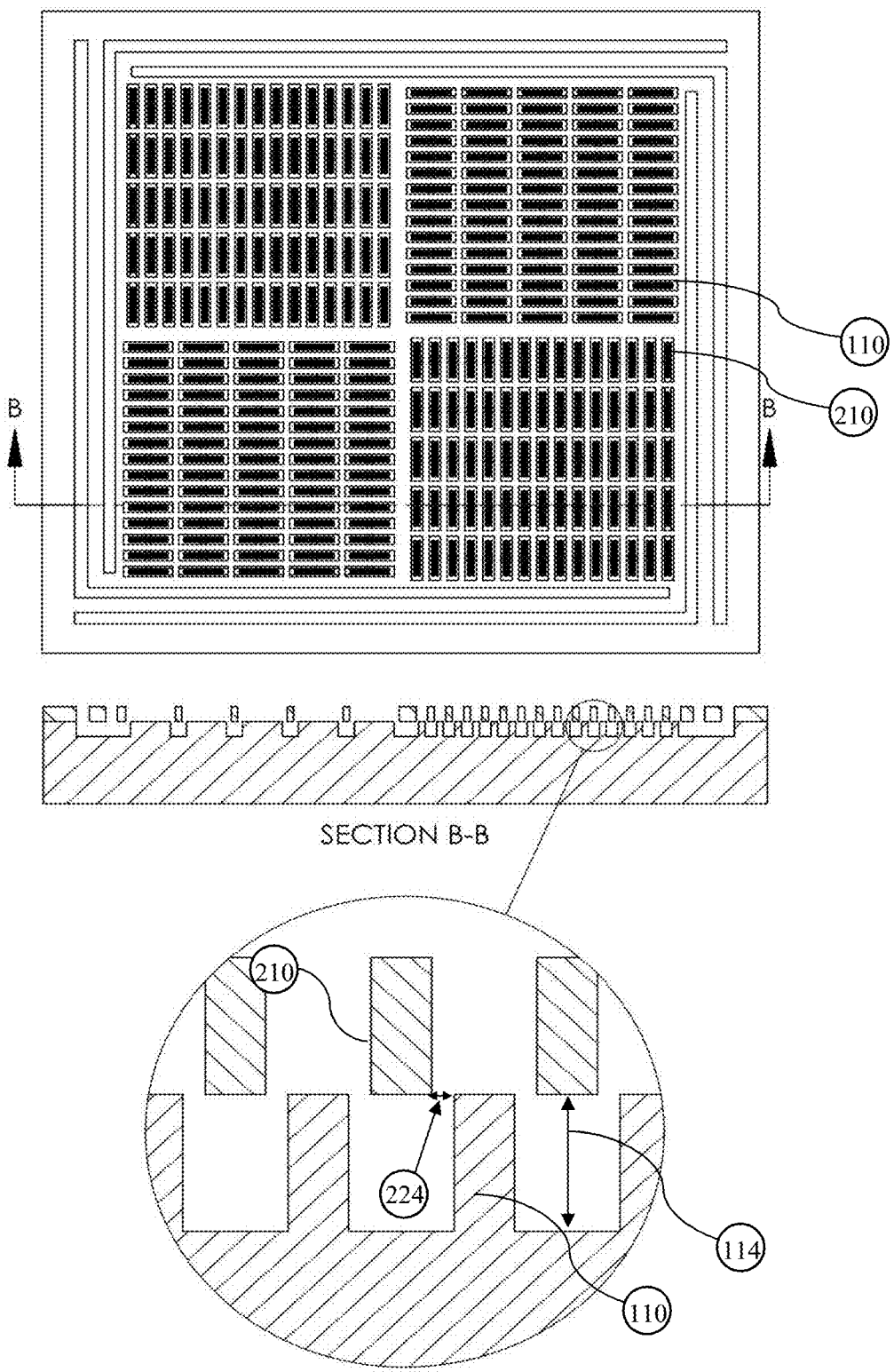
FIG. 5A shows top, cross-sectional, and detailed views illustrating the piston-tube capacitive accelerometer.
Figure 5B:
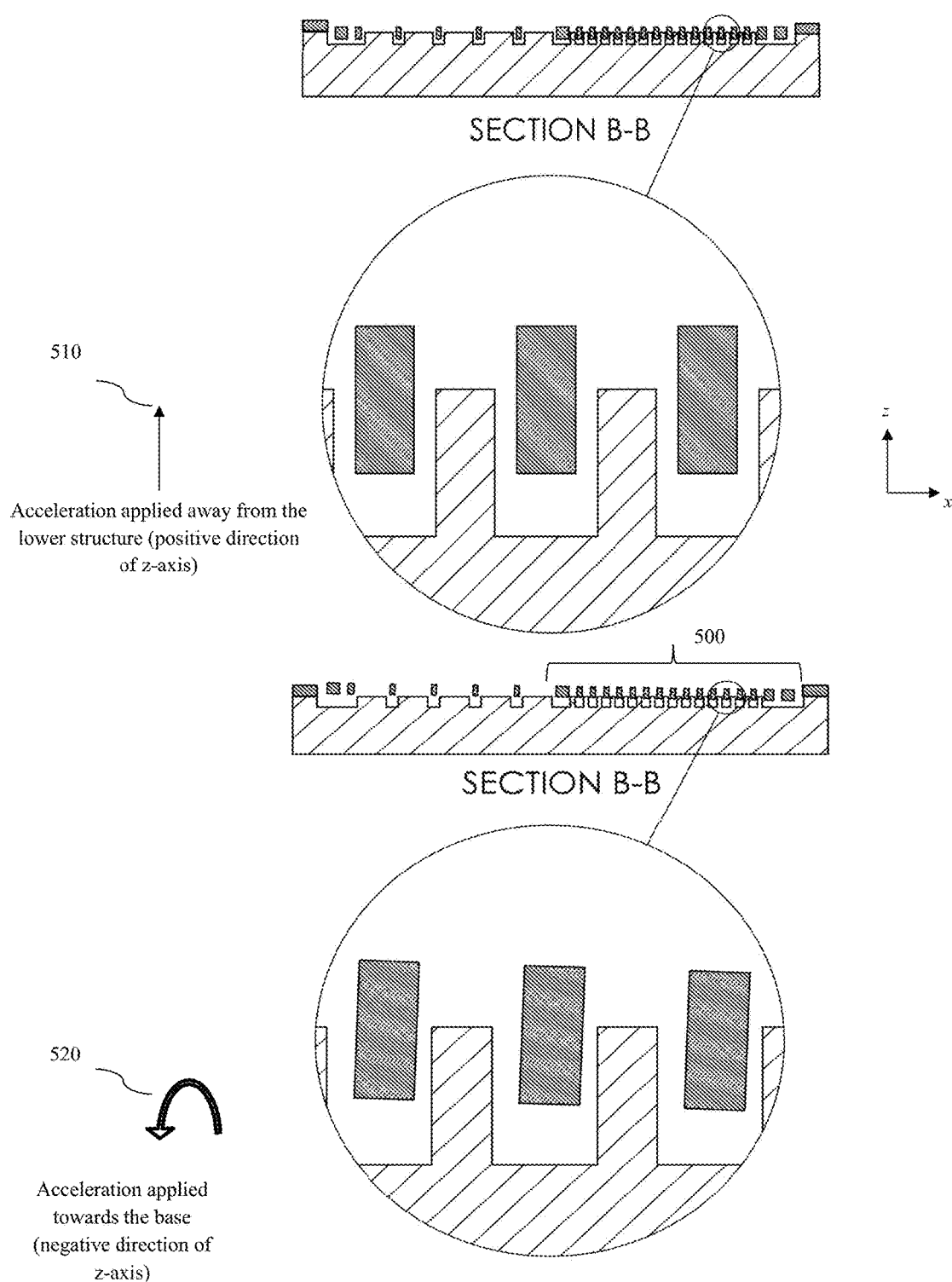
FIG. 5B shows cross-sectional and detailed views illustrating the piston-tube capacitive accelerometer during the application of linear and angular acceleration (only faces along the B-B line are shown for the sake of clarity).

When an external linear acceleration 510, please refer to FIG. 5B, is applied towards the upper structure (i.e. the positive direction of the z-axis), the relative engagement of the moving structure (tubes) and the lower structure (pistons) increases. The change of capacitance between the moving electrode (tubes) and the sensing electrodes (pistons) is detected by the read-out circuit. Hence the acceleration can be determined.

When an external angular acceleration 520, refer to FIG. 5B, is applied about an in-plane axis (i.e. y-axis), the relative motion of the moving electrode (tubes) with respect to the fixed electrode (pistons) is a rotation about the same in-plane axis (i.e. y-axis) in a direction opposite to the applied angular acceleration. The resulting change in the engagement of the tubes to the corresponding pistons is in one half of the accelerometer structure (capacitors 500 that lie on one side of the axis of rotation where the engagement has increased) leads to a change in the capacitance which can be detected by the read-out circuit. The rotary motion of the tubes creates a slight non-linear change of capacitance. The non-linearity is caused by changes in the horizontal gaps between the long sides of the pistons and the tubes. Therefore, in the design of the accelerometer for applications that require angular acceleration measurements, a consideration has to be taken into account for specifying the amount of the horizontal gap such that during the rotation, the change in the gap should not exceed one third of the original horizontal gap 224 to avoid pull-in instability.

The configuration of the springs holding the moving structure could be designed in many ways as it will be clearly apparent to the one who is skilled in the art. One may use suspension springs that extend radially to support the tubes. Another preferred configuration of springs is that the springs extend along the peripheral of the tubes' plate. This configuration of the springs has a number of advantages. First, it allows springs to be largely long (leads to having a high ratio consisting of the longitudinal stiffness to the transverse stiffness as the longitudinal stiffness of the beams is inversely proportional to the length and the transverse stiffness is inversely proportional to the length cube). This high value of the ratio pushes the lateral instability limit further; hence the pull-in voltage value is larger. This is a very important advantage when the accelerometer is operating in the closed loop mode because a large electrostatic force can be generated to keep the mass in the rest position by applying voltages below the pull-in voltage; hence, a wide dynamic range of the accelerometer could be achieved. The second advantage is that it provides a wide room for the electrodes to be multiplied as opposed to the spring configuration in which the springs are extending radially leading to shrinkage of the area of the tubes. Finally, the springs could have the same thickness as that of the tubes, meaning that the fabrication step needed for etching the upper structure to soften the spring could be eliminated, which simplifies the fabrication process.

Figure 6:
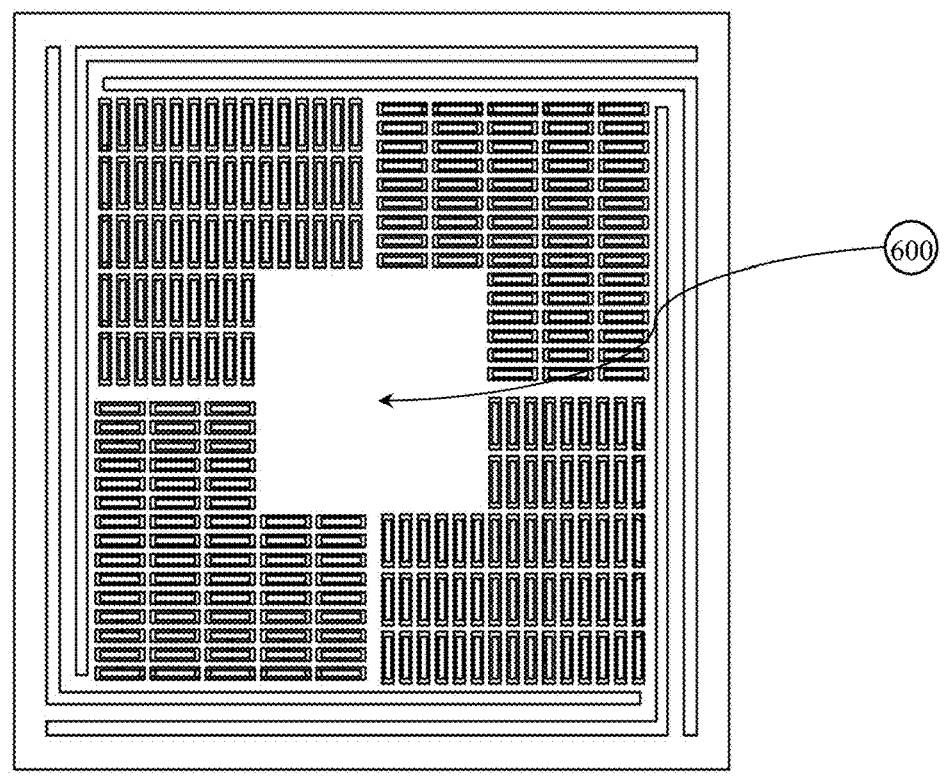
FIG. 6 shows top and isometric views of an embodiment of the piston-tube capacitive accelerometer in which the proof mass is partially solid (lumped).
Figure 6:
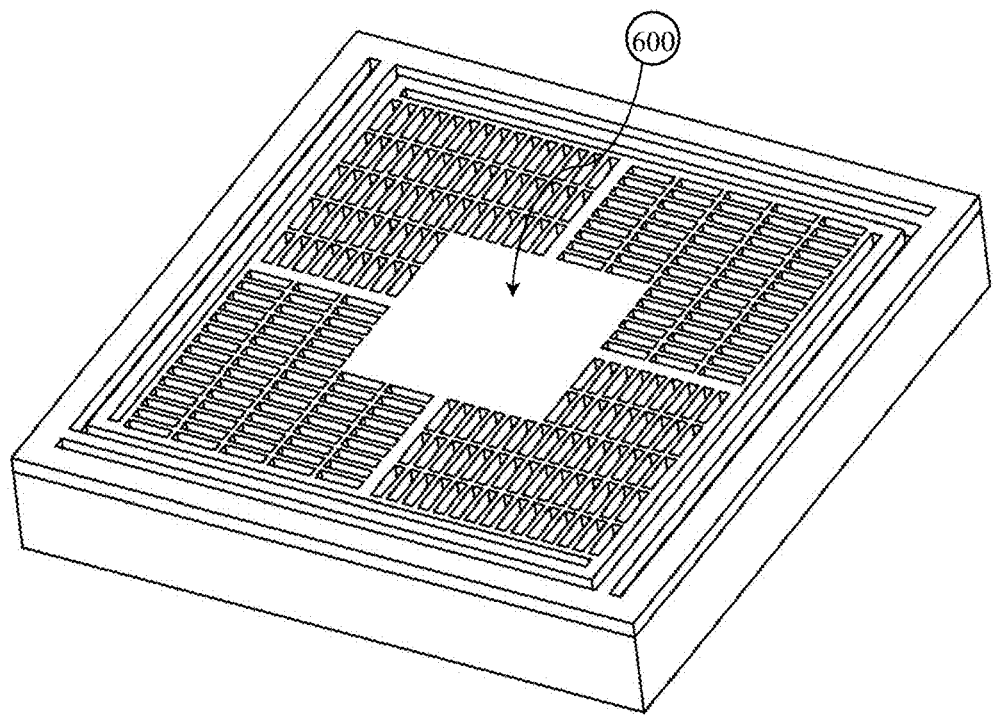

In another embodiment of the current invention, one may design the proof mass of the accelerometer such that it is partially lumped (solid) by removing some of the tubes at the center of the accelerometer. This lumped part 600, shown in FIG. 6, of the proof mass provides a control of the quality factor of the accelerometer by adding a squeeze thin film damping to the system as desired based on the application requirements. This step might be useful when the dynamic range of the accelerometer is needed to be wide as the squeeze thin film damping would reduce the ringing effect near the resonant frequency.

The preferred embodiment of the accelerometer illustrated in FIG. 1-5 is intended to measure the linear vibration/acceleration in a single direction along the out-of-plane axis as the sensing electrodes are positioned on the lower direction of the tubes (i.e. direction towards the substrate). However, to measure the linear acceleration in two directions (positive and negative direction along the out-of-plane axis), two unidirectional accelerometers have to be mounted opposing each other in the measurement unit, so that acceleration in two directions along the out-of-plane axis can be measured. But that requires an additional area of the device.

Figure 7A:
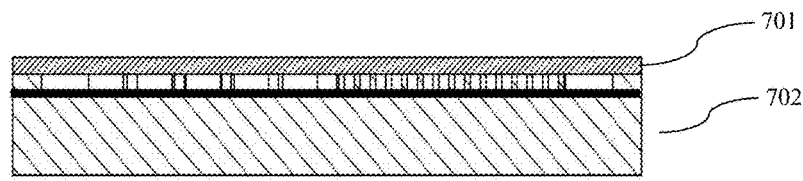
FIG. 7A illustrates the upper structure layer being bonded to the lower structure before etching and patterning of the tubes and extended pistons of the bi-directional MEMS accelerometer.
Figure 7B:
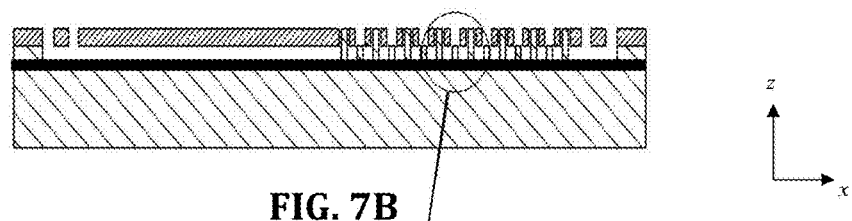
FIG. 7B illustrates a cross-sectional view of the structure of the accelerometer after DRIE etching of the upper structure.
Figure 7C:
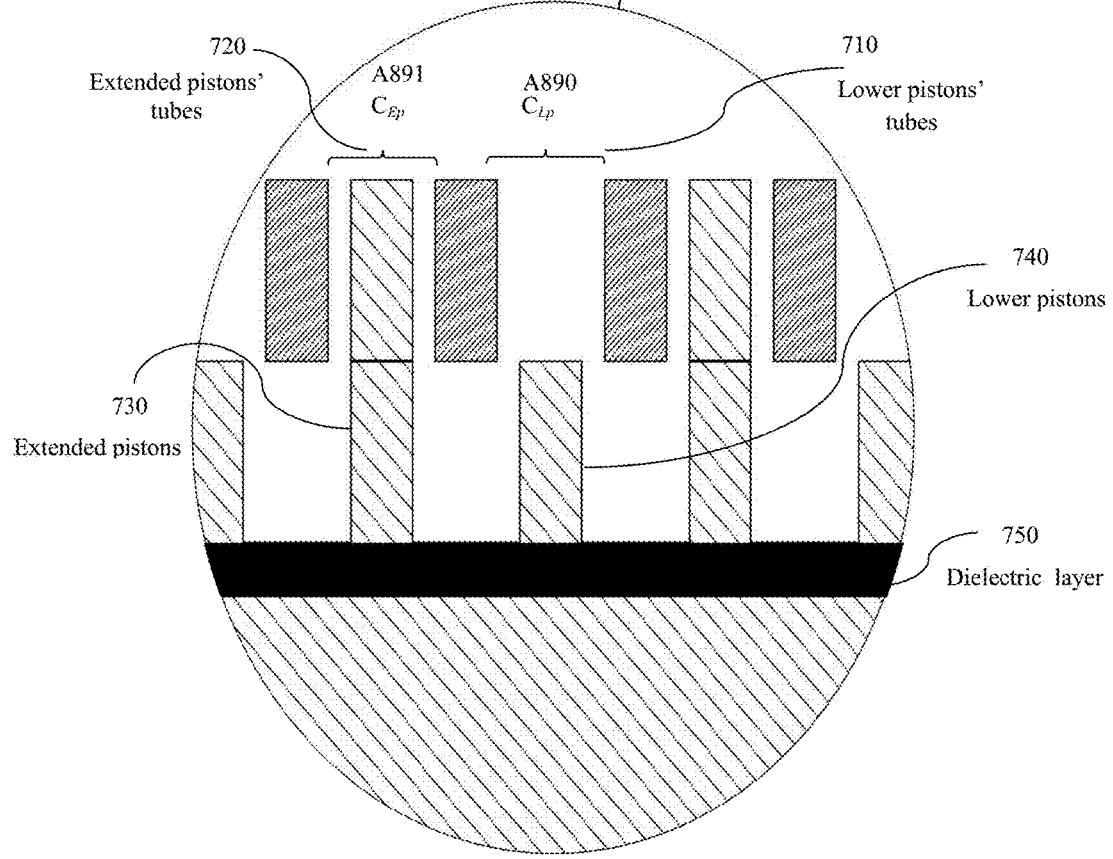
FIG. 7C shows a detailed view of the cross-section of the final structure of the accelerometer after etching the tubes and extended pistons.
Figure 7D:
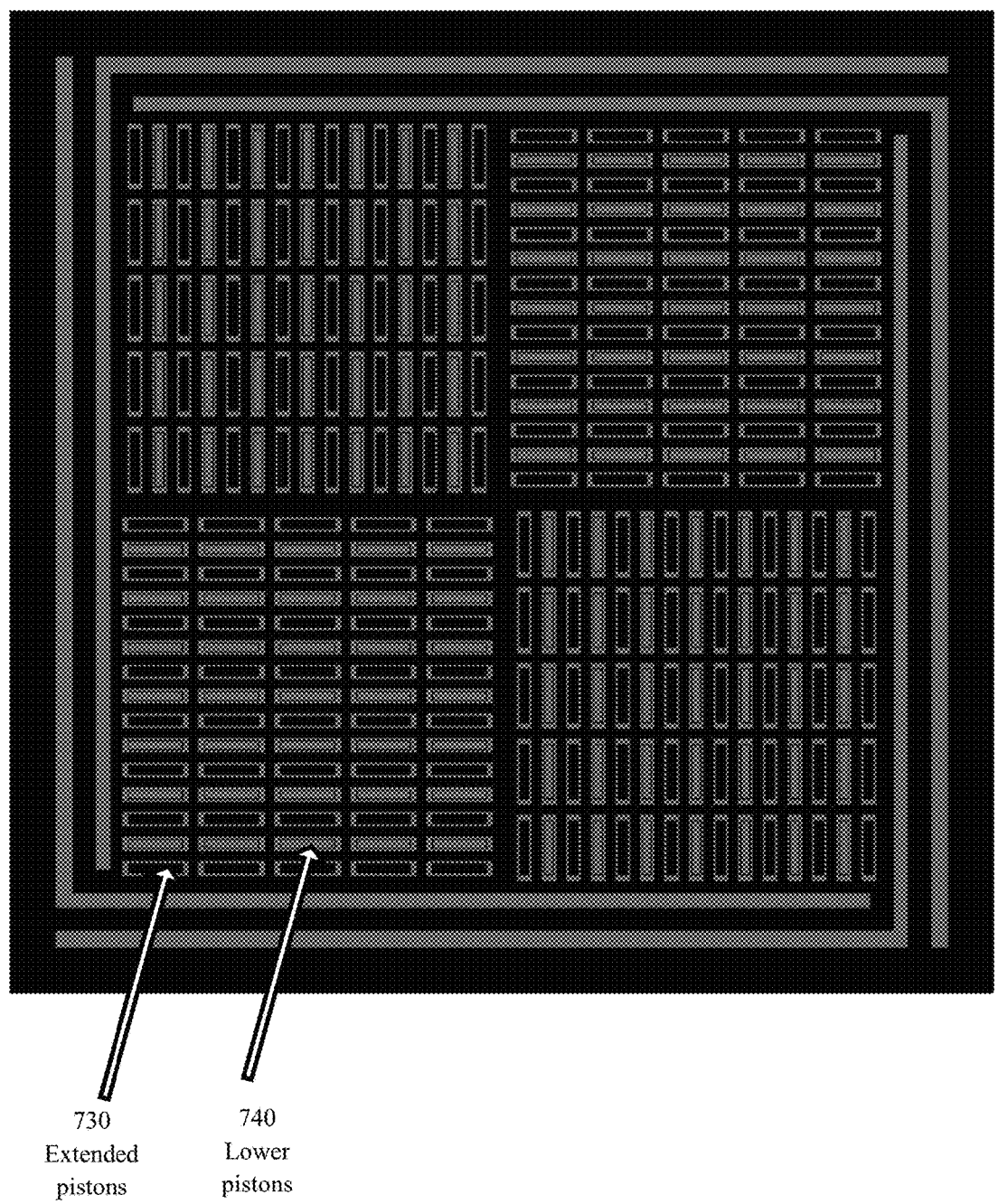
FIG. 7D is a top view of the final structure of the bi-directional accelerometer illustrating the top sides of extended pistons (black) and the lower pistons (grey).

To overcome the limitations of the unidirectional accelerometer, another embodiment of the accelerometer that provides a bidirectional measurement of the vibration/acceleration is described. The bidirectional accelerometer, shown in FIGS. 7-8, has fixed sensing electrodes that measure the linear displacement of the tubes in two directions, positive and negative directions along the z-axis. The accelerometer has a structure similar to the structure of the unidirectional embodiment of the accelerometer. However, about half of the pistons in the lower structure are extended to the level of the tubes in the upper structure. This extension is achieved by adding the features of the extended pistons (rectangles) to the mask containing the tube features. For illustration, FIG. 7A shows the structure of the accelerometer after bonding of the upper structure 701 to the lower one 702 during the fabrication process (e.g. the MicraGEM process). The features of the tubes and the extended pistons, contained in the mask, are photo-lithographically patterned and DRIE etched. FIG. 7B shows the final structure of the accelerometer. The high alignment accuracy between the features in the lower and upper structures in fabrication processes such as the MicraGEM process enables the fabrication of such extended pistons. FIG. 7C shows a detailed cross sectional view of a segment the accelerometer. There are two types of capacitances in the bidirectional accelerometer. The first one is the capacitance that is formed between the lower pistons 740 and the inner sides of the corresponding tubes 710, referred to as $C_{Lp}$ A890, and the second one is formed between the extended pistons 730 and the inner sides of the corresponding tubes 720, referred to as $C_{Ep}$ A891. The lower pistons and the extended pistons are electrically separated by a dielectric layer 750 (i.e. BOX layer when using an SOI wafer).

Figure 8D:
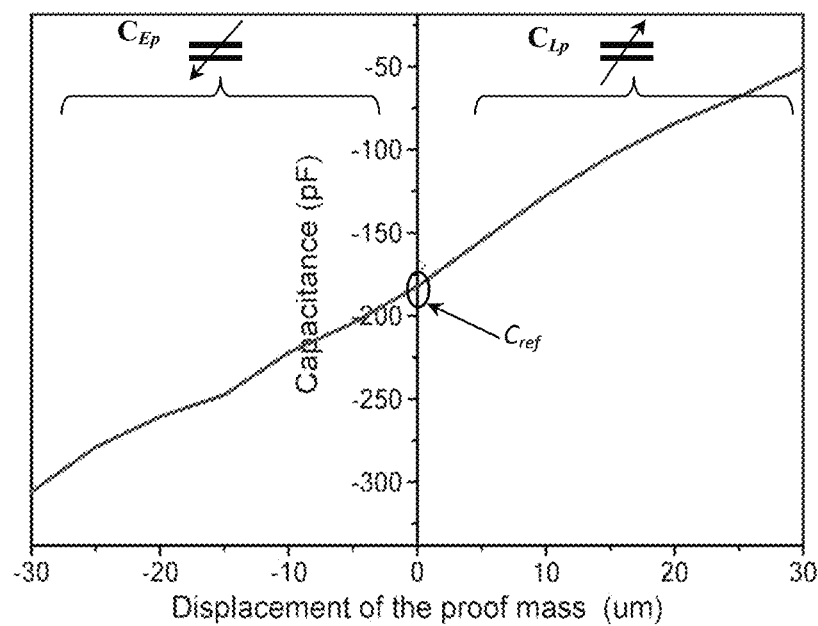
FIG. 8D shows the change of capacitance between the extended pistons and lower pistons with the corresponding tubes in response to a displacement of the proof mass (tubes).

FIG. 8A-C show the operation modes of the bidirectional accelerometer. In the absence of acceleration, refer to FIG. 8A, the proof mass (tubes) is at the rest position, and the capacitance $C_{Ep}$ is at its maximum value as the overlapping area between the extended pistons 820 and the corresponding tubes 840 is at its maximum height (maximum height of the capacitors is bounded by the height of the tubes 870). The capacitance $C_{Lp}$ is at its minimum value (ideally zero) as the overlapping area between the lower pistons 810 and the corresponding tubes 830 is ideally zero. Fringe field capacitance exists in the structure. However, it can be neglected as the change rate in the overlapping area in the presence of external acceleration is very large as opposed to the fringe fields.

These values of the capacitances $C_{Ep}$ (maximum) and $C_{Lp}$ (minimum) at the rest position of the proof mass are considered as parasitic or rest capacitances. Hence, reference capacitors are connected in parallel with these capacitances, $C_{Ep}$ and $C_{Lp}$, in the read-out circuit of the accelerometer to eliminate their effect.

When an external acceleration 930, refer to FIG. 8B, is applied towards the lower structure (negative direction of the z-axis), the positioning of the proof mass (tubes) changes with respect to the lower structure such that $C_{Ep}$ B891 reduces linearly, and hence this linear change of capacitance is detected by the read-out circuit. On the other hand, $C_{Lp}$ B890 ideally doesn't change as there is no electrode engagement between the lower pistons and the corresponding tubes (the change in the overlapping area of $C_{Lp}$ is still zero similar to that of the rest position of the proof mass).

When an external acceleration 960, refer to FIG. 8C, is applied towards the upper structure (positive z-axis direction), the positioning of the proof mass (tubes) changes with respect to the lower structure such that $C_{Lp}$ C890 increases linearly while $C_{Ep}$ C891 ideally doesn't change as the net change in the overlapping area is still zero as the overlapping area is similar to the rest position of the proof mass. This linear change of capacitance is detected by the read-out circuit.

Another configuration for capacitance measurement by the read-out circuit is achieved by electrically connecting the extended pistons ($C_{Ep}$) to the lower pistons ($C_{Lp}$) to form a single capacitance, i.e $C_{total}=C_{Ep}+C_{Lp}$. A reference capacitor has the value of the parasitic capacitance of $C_{Ep}$ and $C_{Lp}$ ($C_{total}$ at rest position) is connected in parallel with the accelerometer total capacitance $C_{total}$ to an op amp circuit. When an acceleration 960 is applied upwards along the positive direction of the out-of-plane axis (z-axis), the distance between the lower structure and moving structure of the accelerometer reduces, hence the overall accelerometer capacitance ($C_{total}$) increases almost linearly (the increase is only in $C_{Lp}$ while the change of $C_{Ep}$ is zero), and the output voltage of the op amp is positive as $C_{total}$ is greater than $C_{ref}$. When the acceleration is applied downward 930, the moving structure of the accelerometer moves away from the lower structure, hence the capacitance of the accelerometer decreases almost linearly (the decrease is only in $C_{Ep}$ while the change of $C_{Lp}$ is zero); the output of the op amp is negative as the accelerometer capacitance ($C_{total}$) becomes less than $C_{ref}$. FIG. 9 shows such an accelerometer capacitance change. This estimated capacitance change is for an embodiment of area of 4×4 mm incorporating thousands of pistons and tubes in response to a relative displacement of the moving structure of the accelerometer along the z-axis. One with ordinary skills in the art will readily understand that for the bi-axial angular acceleration measurement, the accelerometer will have four sensing electrodes (i.e. four arrays of pistons), each sensing electrode of the four comprises extended pistons and lower pistons forming a single capacitor, i.e. $C_{total}$, with the moving electrode.

Such bidirectional accelerometer has the ability to measure the linear acceleration in two directions along the z-axis; however, it has less capacitive sensitivity when compared to the unidirectional accelerometer (the sensitivity is reduced by half as half of the pistons are used to measure the acceleration on each side).

It will be also readily apparent to one who is skilled in the art that the shape of the pistons (teeth) and the corresponding tubes in the present invention could be designed in different geometrical shapes. They could be rectangular as shown in the embodiments illustrated in the present invention, or square-shaped, circular, pentagonal, hexagonal or trapezoidal. The configuration of the springs will then be arranged accordingly such that the longitudinal direction of the springs (the direction that corresponds to the largest stiffness of the springs) is normal to the parallel plate capacitance between the inner sides of the tubes and the outer sides of the pistons (to avoid the lateral instability). And the transverse (sensitive) direction is parallel to the axis of the acceleration needed to be measured.

REFERENCES

[1] B. V. Amini, R. Abdolvand, and F. Ayazi, "Sub-micro-gravity capacitive SOI microaccelerometers," *Dig. Tech. Pap. —Int. Conf. Solid State Sensors Actuators Microsystems, TRANSDUCERS* '05, vol. 1, pp. 515-518, 2005.

[2] D. Zhao, "A Low-Noise CMOS Interface for Capacitive Microaccelerometers," Georgia Institute of Technology, 2009.

[3] B. V. Amini and F. Ayazi, "Micro-gravity capacitive silicon-on-insulator accelerometers," *J. Micromechanics Microengineering*, vol. 15, pp. 2113-2120, 2005.

[4] M. A. ERİŞMİŞ, "MEMS Accelerometers and Gyroscopes for Inertial Measurement Units," MIDDLE EAST TECHNICAL UNIVERSITY, 2004.

[5] N. Yazdi, F. Ayazi, K. Najafi, and S. Member, "Micromachined Inertial Sensors," vol. 86, no. 8, 1998.

[6] L. San and V. Foronda, "Automotive Events Detection using MEMS Accelerometers," Universitat Politècnica de Catalunya.

[7] J. Bernstein, R. Miller, W. Kelley, and P. Ward, "Low-noise MEMS vibration sensor for geophysical applications," *J. Microelectromechanical Syst.*, vol. 8, no. 4, pp. 433-438, 1999.

[8] H. Kulah, J. C. J. Chae, and K. Najafi, "Noise analysis and characterization of a sigma-delta capacitive silicon microaccelerometer," *TRANSDUCERS* '03. *12th Int. Conf. Solid-State Sensors, Actuators Microsystems. Dig. Tech. Pap. (Cat. No. 03TH8664)*, vol. 1, no. 2, pp. 352-361, 2003.

[9] M. F. Pantano, L. Pagnotta, and S. Nigro, "A numerical study of squeeze-film damping in MEMS-based structures including rarefaction effects," *Ital. Res. smart Mater. MEMS*, vol. 23, pp. 103-113, 2013.

[10] C. Acar and A. Shkel, *MEMS Vibratory Gyroscopes: Structural Approaches to Improve Robustness*. 2009, p. 104.

What is claimed is:

1. A MEMS capacitive accelerometer, comprising:
a. a first base plate having a top surface and a thickness;
b. an array of spaced apart teeth electrodes constructed in the thickness of said base plate;
c. each said tooth electrode having a shape, a length, a height, and a thickness;
d. said array of teeth being grouped in one or multiple sub-arrays of teeth each comprising one or more teeth, wherein the teeth in each sub-array of teeth being electrically connected to each other and electrically isolated from other sub-arrays of teeth;
e. each sub-array of teeth being electrically addressable, whereby each sub-array of teeth forms a sensing electrode of said accelerometer;
f. a second plate attached to said base plate and having a structure sized to fit on said base plate, said second plate having a fixed peripheral structure and a moving central structure, whereby the fixed structure being attached to the base plate and the moving central structure forms a proof mass of said accelerometer;
g. an array of spaced apart openings constructed in the thickness of said moving structure said second plate;
h. said array of openings sized and designed to receive and interdigitate with said array of teeth, and said array of openings with each said opening having a length, a width and a height, whereby said array of openings forms a moving electrode of said accelerometer;
i. a plurality of spring means supports and holds said moving structure of said second plate wherein said openings are aligned with respect to said array of teeth and to return the said moving structure to its initial position in the absence of external acceleration, each said spring having a length, a thickness, and a height, whereby the teeth of the base plate penetrate into the openings of the top plate in response to linear acceleration along an out-of-plane axis (z-axis), or/and rotational acceleration about an in-plane axes (x and y) being measured by means of capacitance change detection that is formed between the teeth and the openings.

2. The MEMS capacitive accelerometer of claim 1, wherein said array of teeth electrodes being arc shaped and being radially co-centric with a predefined radial spacing.

3. The MEMS capacitive accelerometer of claim 1, wherein said array of teeth electrodes being substantially rectangular, circular, triangular, trapezoidal, pentagonal, or hexagonal shaped, and each said sub-array of teeth being aligned linearly along their length and forming several linear rows in each said sub-array.

4. The MEMS capacitive accelerometer of claim 1, wherein said array of teeth electrodes being substantially rectangular, circular, triangular, trapezoidal, pentagonal, or hexagonal shaped, and each said sub-array of teeth being aligned radially along their length and forming several curved rows in each said sub-array.

5. The MEMS capacitive accelerometer of claims 3 and 4, wherein said sensing tooth electrodes and moving electrode (openings) form four capacitors.

6. The MEMS capacitive accelerometer of claim 1, wherein the proof mass is partially solid (lumped) at the center of the said moving structure of said second plate, and surrounded by an array of openings.

7. The MEMS capacitive accelerometer of claim 1, wherein said springs being long springs having high ratio of a longitudinal stiffness to a transverse stiffness to allow for a large travel range of the proof mass.

8. The MEMS capacitive accelerometer of claim 1, wherein said springs being extended radially inwards.

9. The MEMS capacitive accelerometer of claim 1, wherein said springs having the same thickness as the height of the opening, whereby eliminating the fabrication step needed for etching the second plate to soften the springs, thereby simplifying the fabrication process.

10. The MEMS capacitive accelerometer of claim 1, wherein a plurality of said pistons are extended upward such that their top surfaces are at the same plane with top surface of said second plate.

11. The MEMS capacitive accelerometer of claim 10, wherein said accelerometer measures the linear acceleration along two directions of the out-of-plane axis.

* * * * *